United States Patent [19]

Fujishima et al.

[11] Patent Number: 4,586,167

[45] Date of Patent: Apr. 29, 1986

[54] SEMICONDUCTOR MEMORY DEVICE

[75] Inventors: Kazuyasu Fujishima; Kazuhiro Shimotori; Hideyuki Ozaki; Hideshi Miyatake, all of Itami, Japan

[73] Assignee: Mitsubishi Denki Kabushiki Kaisha, Tokyo, Japan

[21] Appl. No.: 568,138

[22] Filed: Jan. 4, 1984

[30] Foreign Application Priority Data

Jan. 24, 1983 [JP] Japan .................................. 58-11178
Jan. 26, 1983 [JP] Japan .................................. 58-12501

[51] Int. Cl.$^4$ ............................................ G11C 13/00
[52] U.S. Cl. ..................................... 365/189; 365/193
[58] Field of Search ............... 365/189, 193, 194, 195, 365/230

[56] References Cited

U.S. PATENT DOCUMENTS 4,156,938  5/1979  Proebsting et al. .
4,344,156  8/1982  Eaton, Jr. et al. .
4,491,910  1/1985  Caudel et al. ........................ 365/189
4,510,602  4/1985  Engdahl et al. ..................... 365/189

Primary Examiner—Terrell W. Fears
Attorney, Agent, or Firm—Lowe Price LeBlanc Becker & Shur

[57] ABSTRACT

Disclosed is a semiconductor memory device which is operable in a selected one of page mode and nibble mode, depending upon the length of time in which an external column address strobe signal stays at a specific level. The semiconductor memory device comprises a circuit for discriminating the length of time where the external column address strobe signal is at a specific level with a predetermined period of time. Data is outputted in page mode in response to one of results of such discrimination and in nibble mode in response to the other result of the discrimination. The discriminating circuit may comprise a second internal column address strobe signal generator and a delay circuit. The second internal column address strobe signal generator includes a NAND circuit at its first stage, and the delay circuit is designed to have different delay times at the building-up and downward edges of an input signal applied thereto. The output of the discriminator is used to operate and reset an output circuit whereby one of the output modes is selected.

12 Claims, 13 Drawing Figures

SEMICONDUCTOR MEMORY DEVICE

BACKGROUND OF THE INVENTION

1. Field of the Invention

This invention relates to a semiconductor memory device, and more particularly to a semiconductor memory device wherein data stored therein can be read out in any selected one of page mode and nibble mode.

2. Description of the Prior Art

One of conventional ways to read out data in dynamic semiconductor memory devices is a so-called page mode. In this mode, one of word lines in a memory array is selected and then a desired one of digit lines is sequentially selected, whereby data are sequentially read out from memory cells at intersections of the selected word lines and digit lines. Referring to FIG. 1 which is a timing chart for operation events in this page mode, the mode will be discussed in detail.

(i) An external row address strobe signal (Ext.$\overline{RAS}$) applied to the semiconductor memory device from the external of the device becomes active "low" state, so that an internal row address strobe signal (Int. RAS, referred to as "RAS" hereinafter), or the output of an internal RAS buffer circuit changes from low to high. In response to this change, an internal row address is generated at address buffer circuit ($A_0$–$A_i$), and one of word lines corresponding to the row address is selected.

(ii) An external column address strobe signal (Ext. $\overline{CAS}$) externally applied to the semiconductor memory device is placed into active "low" state, so that an internal column address strobe signal (Int. CAS, referred to as "CAS" hereinafter) or output of an internal CAS buffer circuit changes from low to high. In response to this change, an internal column address is generated at the address buffer circuits, and one of digit lines which corresponds to the column address is selected. At this stage of operation, the one of the word lines and the one of the digit lines are selected so that data are read out from a memory cell at the intersection of the two lines.

(iii) After that, Ext. $\overline{CAS}$ is brought into inactive "high" state while the row address is fixed low. Using the transition as a trigger, an internal $\overline{CAS}$ signal (Int. $\overline{CAS}$) outputted from the internal CAS buffer circuit changes from low to high. A column decoder and a data output circuit are reset in response to the change.

(iv) When Ext. $\overline{CAS}$ becomes low again, a column address different from the previous one is generated to select one of the digit lines corresponding to the new column address. Since the row address is not changed during these operation, data are read out from a memory cell at the intersection of the previously selected word line and currently selected digit line.

In the page mode, data stored in the memory cells which are connected to the selected word line can be sequentially read out by sequentially selecting the digit lines by means of column addresses.

Meanwhile, a new method of reading out data, called "nibble mode", has recently been suggested and studied for practical use. For example, this nibble mode is disclosed in Digest of Technical Papers, IEEE International Solid-State Circuits Conference, 1981, pp. 84 by S. S. Sheffield et al. In the nibble mode, when one of row addresses and one of column addresses are specified, a nibble or 4 bits of data are read out from a memory array. Referring to FIG. 2 showing a timing chart of the operation in the nibble mode and FIG. 3 showing an example of a circuit formed on a 64K bit dynamic RAM for the nibble mode, data reading operation in the nibble mode will be discussed in detail.

(i) Ext. $\overline{RAS}$ is brought into active "low" state so that the internal RAS buffer circuit RB becomes operable to change its output Int. RAS from low to high. In response to this transition, address buffer circuits ($A_0$–$A_7$) become operable to generate a row address signal which in turn is applied to a row decoder RD which decodes the row address signal to select one of 256 word lines ($WL_0$–$WL_{255}$).

(ii) Ext. $\overline{CAS}$ then changes to low. In response to this transition, the internal CAS buffer circuit CB becomes operable to change its output CAS from low to high. The address buffer circuits ($A_0$–$A_7$) become operable in response to such transition to generate a column address signal. Out of the outputs of the address buffer circuits, the outputs of $A_0$–$A_5$ are fed to a column decoder CD which decodes the signal to select four of 256 digit lines. Data are read out from four memory cells MC at the intersections of the one of the word lines selected in (i) above and these four digit lines. The 4 bit data are loaded into data registers ($DR_1$–$DR_4$) by way of four pairs of I/O lines ($I/O_1$–$I/O_4$), respectively. The remaining outputs of the address buffer circuits $A_6$ and $A_7$ are fed to data select shift registers ($DS_1$–$DS_4$). These 2 bits select and activate one of the data select registers ($DS_1$–$DS_4$), rendering conductive one of four switches ($SW_1$–$SW_4$) connected to the activated one of the data select registers. The data stored in the data register connected to the switch in such conductive state are outputted through an output buffer circuit OB.

(iii) An indicated in FIG. 2, Ext. $\overline{CAS}$ changes to high and then to low while Ext. $\overline{RAS}$ is held low. In response to the output of the CAS buffer circuit the shift register becomes operable and the switch previously in conductive state becomes nonconductive. The next switch then becomes conductive so that data stored in the data register connected to that newly conductive switch are delivered through the output buffer circuit OB. For example, assuming that $SW_1$ is initially selected and rendered conductive by the outputs of $A_6$ and $A_7$, the shift register advances one step through the this procedure and $SW_1$ becomes nonconductive and $SW_2$ conductive.

In this manner, the shift registers ($DS_1$–$DS_4$) are operated by changing Ext. $\overline{CAS}$ in the order of high→low high→low while Ext. $\overline{RAS}$ is held low, whereby data in the data registers ($DR_1$–$DR_4$) are sequentially read out. The column address need be given at the first step but not every step. In other words, since there is no need to give the column addresses from time to time in the nibble mode unlike the page mode, operation of the internal CAS buffer circuit CB and the address buffer circuits ($A_0$–$A_7$) is not necessary from time to time. The nibble mode allows high speed data reading as compared with the page mode. The nibble mode is however disadvantageous in that only 4 bits of data as selected by the column address at the first step may be read out.

In other words, the page mode and the nibble mode have the inherent advantages and disadvantages, respectively, and it is very convenient if the semiconductor memory device is selectively operable in the page mode or the nibble mode. Although the page mode and the nibble mode are totally different in operational mode in the semiconductor memory device, it is noted from FIGS. 1 and 2 that the timing relationship between Ext. $\overline{RAS}$ and Ext. $\overline{CAS}$ in both the modes is completely identical. With the conventional semiconductor memory device, selective use of the two modes is impossible and only one of the two modes is available.

SUMMARY OF THE INVENTION

It is the primary object of the present invention to provide a semiconductor memory device which is capable of operating selectively in a page mode or a nibble mode.

It is another object of the present invention to provide a semiconductor memory device which is capable of selecting a page mode or a nibble mode through an address strobe signal applied from the external of the device.

To achieve the above objects, the present invention provides a semiconductor device having a memory array storing data to be read out by an external row address strobe signal and an external column address strobe signal, said semiconductor device comprising means for generating an internal row address strobe signal, first internal column address strobe signal generator means and means responsive to the output of said first internal column address strobe signal generator means for discriminating the length of time where said external column address strobe signal is at a given level with a predetermined length of time. The device further comprises data address signal generator means responsive to the output of said internal row address signal generator means and the output of said external address strobe signal discriminating means for generating an address signal, means responsive to those signals for reading out data and data output means. In a preferred embodiment, said discriminating means comprise delay means and second internal column address strobe signal generator means.

The advantage of the present invention as set forth above is that the page mode and the nibble mode are selectively available in the semiconductor device.

Another advantage of the present invention is the capability to select the page mode and the nibble mode by the external column address strobe signal.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
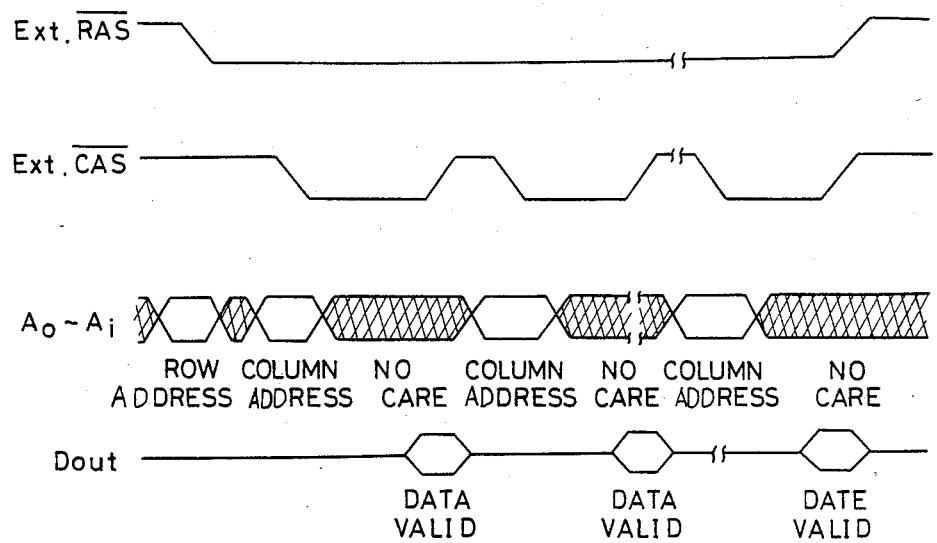
FIG. 1 is a timing chart showing timing relationship of a page mode in a conventional semiconductor memory device.
Figure 2:
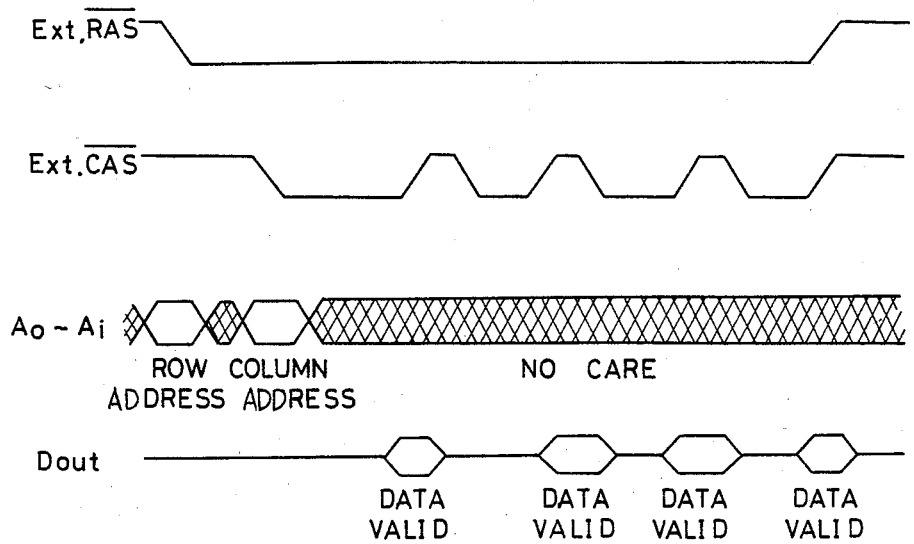
FIG. 2 is a timing chart showing timing relationship of a nibble mode in a conventional semiconductor memory device.
Figure 3:
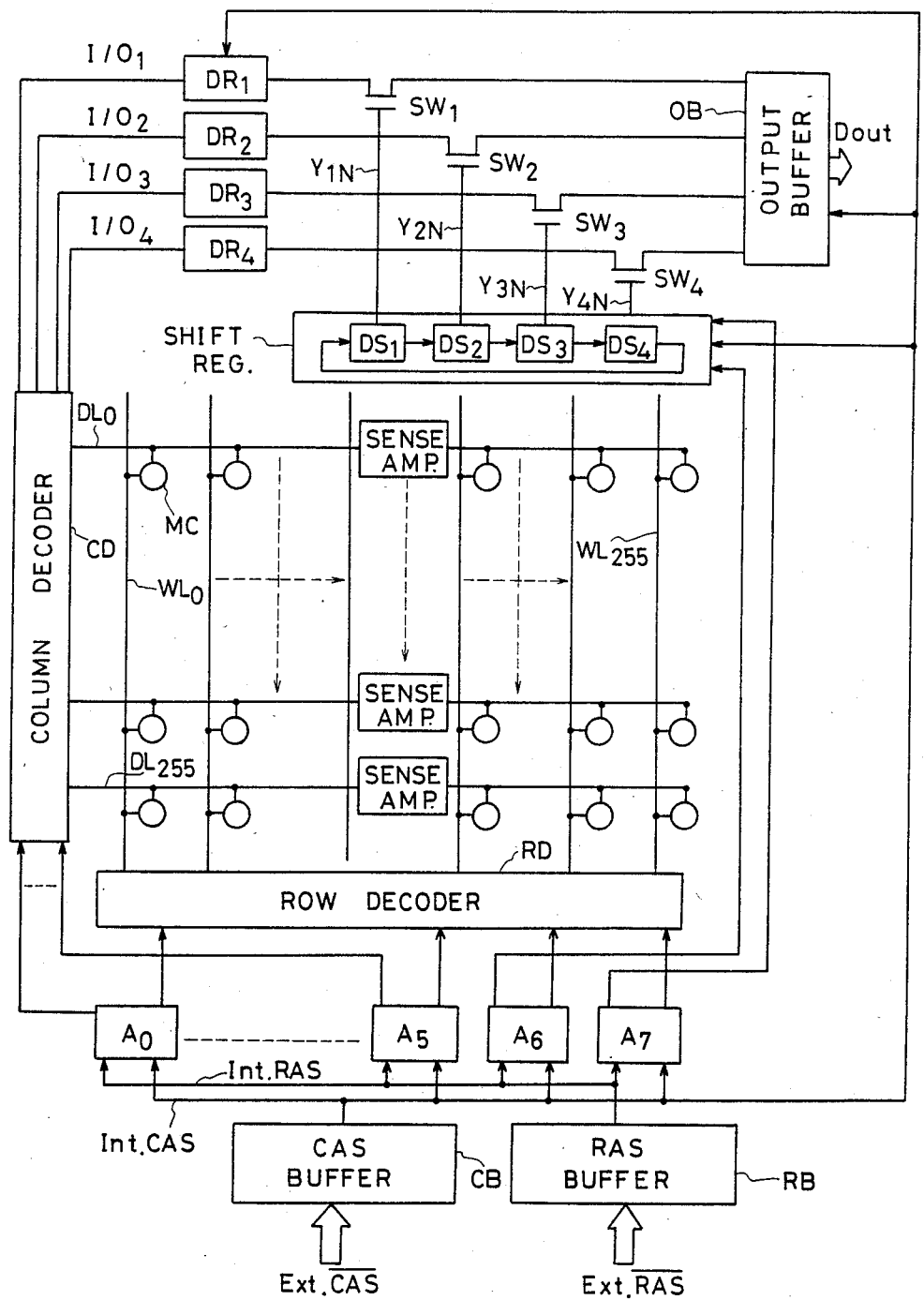
FIG. 3 is a block diagram of a conventional semiconductor memory device wherein the nibble mode is available.
Figure 4:
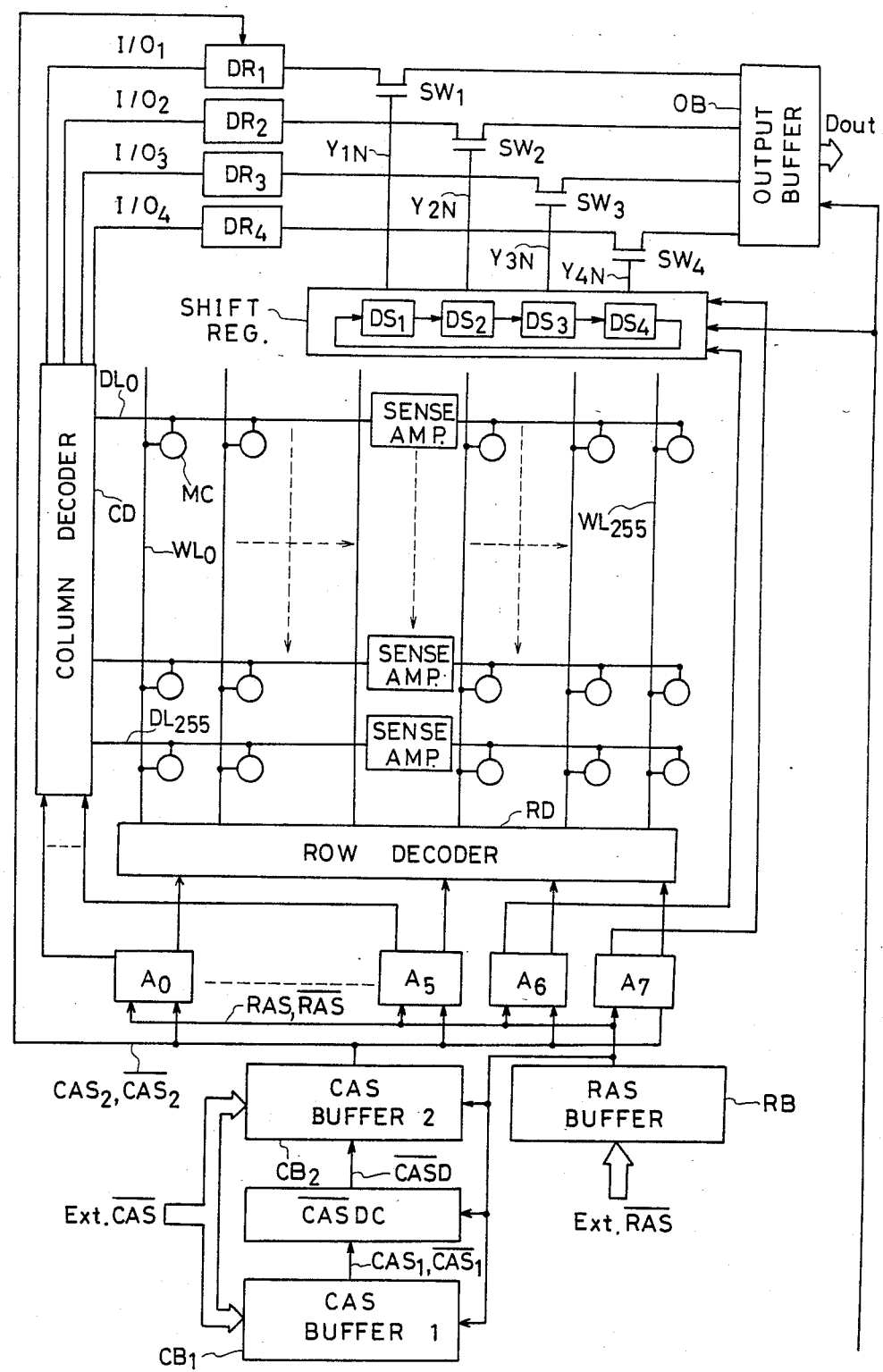
FIG. 4 is a block diagram of a semiconductor memory device according to a first embodiment of the present invention.

In FIG. 4, there is illustrated a block diagram of a schematic structure of a semiconductor memory device according to a first embodiment of the present invention. This device may be formed on a single semiconductor chip, especially on a single 64K dynamic RAM chip. It is clear from comparison with the conventional semiconductor memory device as shown in FIG. 3 that there are provided two internal CAS buffer circuits ($CB_1$ and $CB_2$) and a $\overline{CASD}$ generator.

The constitutional elements of the memory device and interconnections therebetween will now be discussed. In FIG. 4, memory cells MC are arranged to form a memory array especially a square array of 256 ($=2^8$) high $\times$ 256 ($=2^8$) wide. There are disposed over the memory array 256 word lines ($WL_0$–$WL_{255}$) in a vertical direction and 256 digit lines ($DL_0$–$DL_{255}$) in a horizontal direction. Each of the memory cells is disposed at the intersection of one of the word lines and one of the digit line. Each of the digit lines has a sense amplifier at the middle thereof for amplification of signals read out. Each of the word lines is connected to a row decoder RD, while each of the digit lines is connected to a column decoder CD. The outputs of the column decoder are fed to four data registers ($DR_1$–$DR_4$) by way of four input/output lines ($I/O_1$–$I/O_4$) and the outputs of the four data registers are led to an output buffer circuit OB through conductive paths of switches ($SW_1$–$SW_4$), respectively.

The outputs of the semiconductor device are obtainable through the output buffer circuit OB. The respective gates of the switches $SW_1$–$SW_4$ are connected to four data select registers ($DS_1$–$DS_4$) disposed in a shift register SR.

An external column address strobe signal Ext. $\overline{CAS}$ for the memory array is supplied to the first CAS buffer circuit $CB_1$ and the second CAS buffer circuit $CB_2$. The output of the first CAS buffer circuit $CB_1$ is supplied to the $\overline{CASD}$ generator $\overline{CASDC}$, the shift register SR and the output buffer circuit OB. The output of the $\overline{CASD}$ generator $\overline{CASDC}$ is fed to the second CAS buffer circuit $CB_2$. The output of the second CAS buffer circuit $CB_2$ is divided and supplied respectively to address buffer circuits $A_0$–$A_7$ and the data registers $DR_1$–$DR_4$.

An external row address strobe signal Ext. $\overline{RAS}$ for the memory array, on the other hand, is fed to an RAS buffer circuit RB the output of which is supplied to the address buffer circuits $A_0$–$A_7$, the first and second CAS buffer circuits $CB_1$ and $CB_2$ and the $\overline{CASD}$ generator $\overline{CASDC}$. Row address signal outputs from the address buffer circuits $A_0$–$A_7$ are applied to the row decoder. The column address signal outputs from the address buffer circuits $A_0$–$A_5$ are fed to the column decoder, while the output signals from the address buffer circuits $A_6$ and $A_7$ are fed to the data select registers $DS_1$–$DS_4$ in the shift register SR.

Detailed circuit arrangements of the characteristic components of the semiconductor memory device of FIG. 4 will be discussed.

FIRST CAS BUFFER CIRCUIT (CB$_1$)

Figure 5:
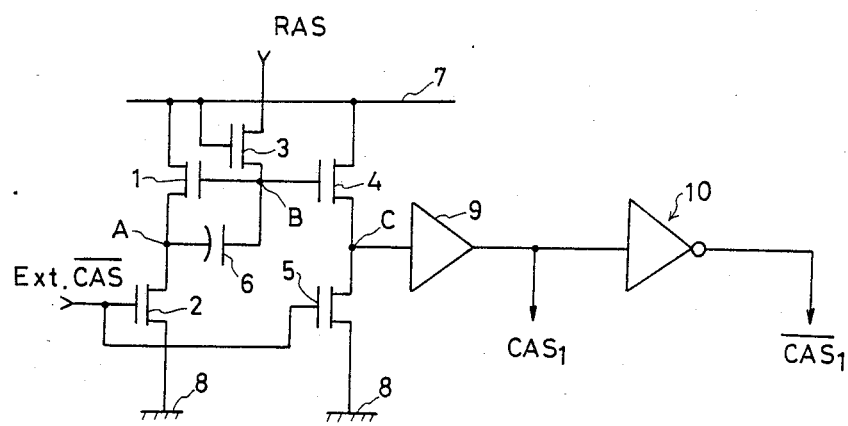
FIG. 5 is a block diagram of a first CAS buffer circuit used in the embodiments of the present invention.

The first CAS buffer circuit CB$_1$ is designed to receive Ext. $\overline{CAS}$ signal and generate a first internal column address strobe signal (CAS$_1$) and its inverted signal ($\overline{CAS}_1$). The first CAS buffer circuit CB$_1$ may be of the same structure as that of the conventional CAS buffer circuit (CB in FIG. 3) and is typically configured as shown in FIG. 5. In FIG. 5, CB$_1$ comprises N channel MOS transistors (referred to as "MOST" hereinafter) 1–5. CB$_1$ further includes a bootstrap capacitance 6, a source line 7, a grounding terminal 8, an amplifier 9 and an inverter 10. The circuit elements as shown in FIG. 5 are those necessary for explanation of the present invention and those unnecessary therefore are omitted in FIG. 5. The outputs CAS$_1$ and $\overline{CAS}_1$ of CB$_1$ are supplied to the $\overline{CASD}$ generator and also used for controlling the shift registers $DS_1$–$DS_4$ and the output buffer circuit OB.

$\overline{CASD}$ GENERATOR ($\overline{CASDC}$)

Figure 7:
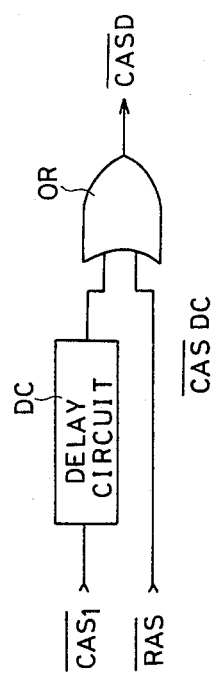
FIGS. 7 and 8 are block diagrams of example of a $\overline{CASD}$ generator used in the embodiments of the present invention.
Figure 8:
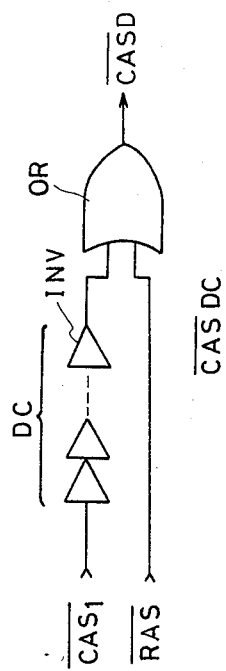
Figure 9:
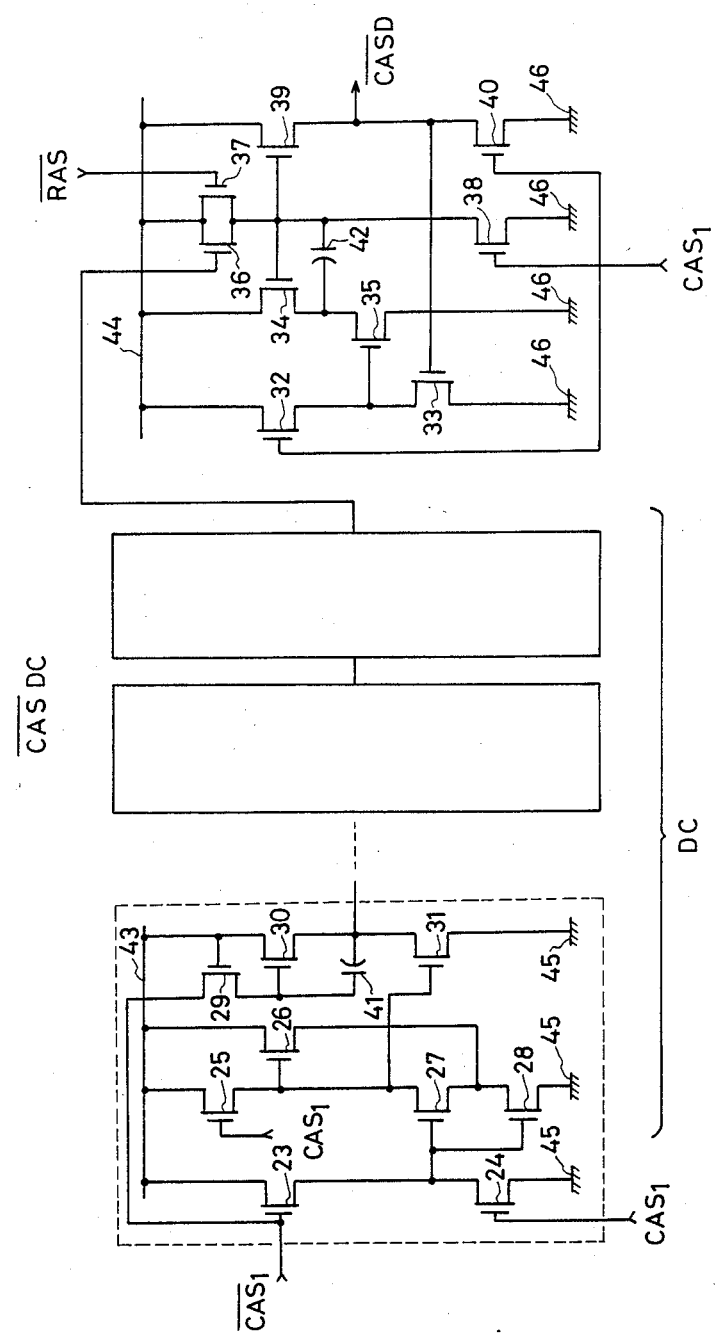
FIG. 9 is a circuit diagram of the $\overline{CASD}$ generator indicated in FIGS. 7 and 8.

The $\overline{CASD}$ generator ($\overline{CASDC}$) is a circuit which receives the output $\overline{CAS}_1$ of CB$_1$ and delivers the same after proper processing including time delay of that output. Block diagrams of $\overline{CASDC}$ are illustrated in FIGS. 7 and 8 and its typical configuration in FIG. 9. Referring to FIG. 7, $\overline{CASDC}$ comprises a delay circuit DC for delaying $\overline{CAS}_1$ received and a logical sum circuit OR for evaluating the logical sum of the output of the delay circuit DC and the output $\overline{RAS}$ of the RAS buffer circuit and providing the output $\overline{CASD}$ thereof representative of the sum. The delay circuit, as also illustrated in FIG. 8, comprises a serial connection of a prodetermined number of inverter stages INV. In FIG. 9 illustrating a detailed configuration of the $\overline{CASD}$ generator, the inverter stages are represented by the dot line or solid line. Each of the inverters comprises MOST's 23–31, a bootstrap capacitance 41, a source line 43 and grounding terminals 45. The final stage of $\overline{CASD}$ is the OR gate circuit which comprises MOST's 32–40, a bootstrap capacitance 42, a source line 44 and grounding terminals 46. It is noted that the output of signal of DC drops to a low level without any substantial delay when $\overline{CAS}_1$ drops to a low level, and rises to a high level with a delay time (t) when $\overline{CAS}_1$ rises to high.

SECOND CAS BUFFER CIRCUIT (CB$_2$)

The second CAS buffer circuit CB$_2$ is a circuit that receives the output of the $\overline{CASD}$ generator and generate a second internal column address strobe signal (CAS$_2$) and its inverted signal ($\overline{CAS}_2$). This circuit is typically illustrated in FIG. 6 and comprises MOST's 11–17, a bootstrap capacitance 18, a source line 19, grounding terminals 20, an amplifier 21 and an inverter 22. The first stage of CB$_2$ is a NAND gate which receives as its inputs Ext. $\overline{CAS}$ and $\overline{CASD}$ and includes a pair of MOST's 12 and 13 and a pair of MOST's 16 and 17. Out of the output signals of CB$_2$, CAS$_2$ is used for controlling generation of column addresses, startup of the data registers and so forth and $\overline{CAS}_2$ is used for controlling resetting of the column decoder and the data registers and so forth. A combination of CB$_2$ and $\overline{CASDC}$ operates as a discriminator which discriminates the period where Ext. $\overline{CAS}$ is at a high level with t, in the following way.

Figure 10:
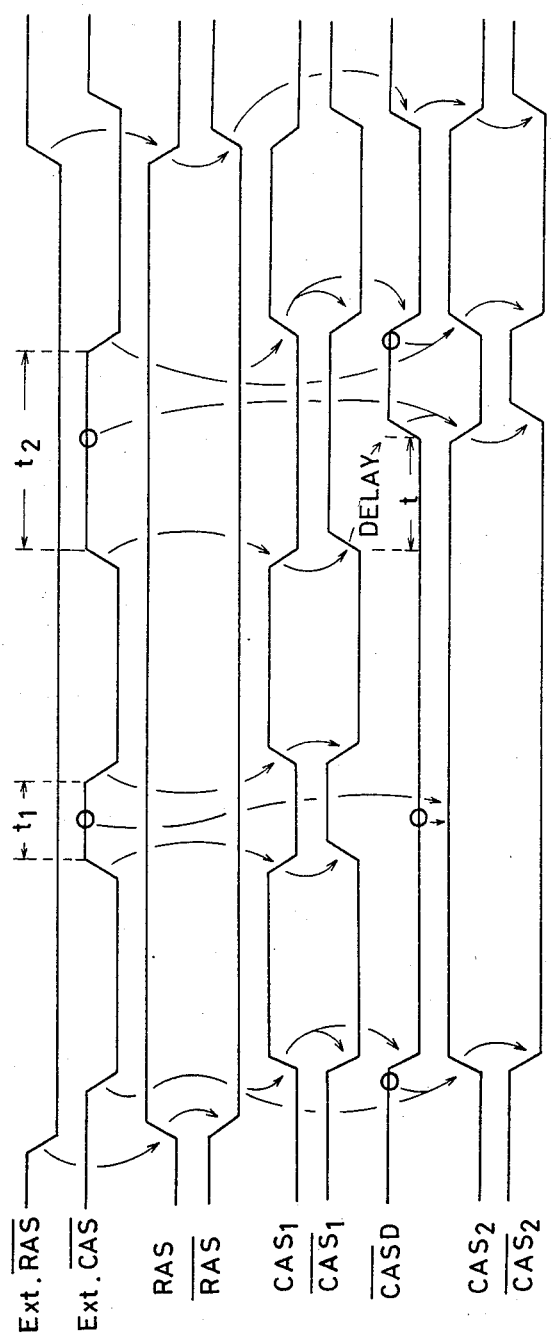
FIG. 10 is a timing chart showing various waveform in the semiconductor memory device according to the first embodiment of the present invention as shown in FIG. 4.

Next, operation of the semiconductor device of FIG. 4 including the above described circuits will be discussed by reference to output waveforms developing at respective points in the circuits. In the following description, reference is always made to FIG. 10 which is a timing chart showing timing relationships among those output waveforms. In FIG. 10, the arrows represent signals which trigger subsequent events in a sequence of operation.

(i) The external row address strobe signal Ext. $\overline{RAS}$ becomes active "low" state. The RAS buffer circuit RB receiving as its input the Ext. $\overline{RAS}$ is adapted to invert this input signal in synchronism with the same. When Ext. $\overline{RAS}$ changes to low, the output of RB, RAS rises up to a high level. This transition initiates operation of the address buffers $A_0$–$A_7$ and thus generation of the row address. The row address so generated is decoded through the row decoder RD to select one of the word lines. At the same time RAS is supplied to CB$_1$. Since the gate of MOST 3 is connected to the source line 7 and the MOST 3 is in ON-state, node B in CB$_1$ as shown in FIG. 5 is charged up to a high level so that the gates of MOST's 1 and 4 are brought to a high level. This implies that MOST's 1 and 4 are turned on. Since Ext. $\overline{CAS}$ has been high until the moment, MOST's 2 and 5 are held on. Provided that the ratio of MOST 1 to MOST 2 and that of MOST 4 to MOST 5 are selected to be sufficiently high, nodes A and C are at a low level. As a result, CAS$_1$ is low, $\overline{CAS}_1$ is high and $\overline{CASD}$ is high (see FIG. 7).

Figure 6:
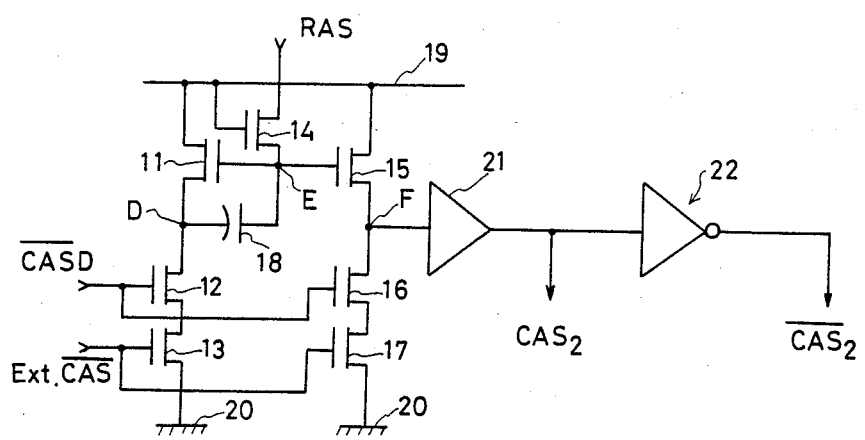
FIG. 6 is a block diagram of a second CAS buffer circuit used in the embodiments of the present invention.

Because of Ext. $\overline{CAS}$ and $\overline{CASD}$ being high, CAS$_2$ and $\overline{CAS}_2$ available through the output of the NAND circuit in the circuit arrangement of FIG. 6 are low and high, respectively. No column address signal has not developed at this moment.

(ii) Then, Ext. $\overline{CAS}$ becomes active "low" state. MOST's 2 and 5 in the circuit arrangement of FIG. 5 are turned off so that nodes A and C are at a high level and CAS$_1$ changes to high and $\overline{CAS}_1$ changes to low. It is noted that CAS$_1$ is an inverted signal synchronous with Ext. $\overline{CAS}$ and $\overline{CAS}_1$ developing in response to CAS$_1$ is a signal synchronous with Ext. $\overline{CAS}$. Transition of $\overline{CAS}_1$ to a low level causes the output $\overline{CASD}$ of $\overline{CASDC}$ to drop to a low level. As stated previously, the output of the delay circuit DC drop without any delay at the downward edge of $\overline{CAS}_1$. Consequently, transition of $\overline{CASD}$ to a low level takes place substantially at the same time as the moment where $\overline{CAS}_1$ changes to low. Since the first stage of CB$_2$ is the NAND circuit receiving Ext. $\overline{CAS}$ and $\overline{CASD}$, the output CAS$_2$ of CB$_2$ changes to high, while $\overline{CAS}_2$ changes to low. As is clear from the circuit arrangement of FIG. 6, this transition is determined by the time where $\overline{CASD}$ or Ext. $\overline{CAS}$ changes to low first. Since CAS$_1$ changes to high in response to change of Ext. $\overline{CAS}$ to a low level and $\overline{CASD}$ changes to low in response to change of CAS$_1$ to a high level, it is understood that Ext. $\overline{CAS}$ always changes to low earlier. The building-up edge of CAS$_2$ is therefore determined by Ext. $\overline{CAS}$ at all times. When CAS$_2$ changes to high, the address registers $A_0$–$A_7$ becomes operable to generate a particular column address. Out of the column address signals, the signals from $A_0$–$A_5$ are decoded in the column decoder to select one of the digit lines. By selecting the one of the word lines and the one of the digit lines, 4 bits of data are loaded into the data registers ($DR_1$–$DR_4$) by way of the I/O lines ($I/O_1$–$I/O_4$). The remaining 2-bit column address outputs from the address registers $A_6$ and $A_7$ are fed to the shift register SR, which selects one of the data select registers ($DS_1$–$DS_4$) in response thereto. This results in that one of the switches ($SW_1$–$SW_4$) becomes conductive and data in the data register connected to that switch in conductive state are outputted via the output buffer OB.

(iii) Ext. $\overline{CAS}$ changes to high while Ext. $\overline{RAS}$ is held low. Then, $CAS_1$ changes to low and $\overline{CAS}_1$ changes to high. However, since the delay circuit DC for $\overline{CASD}$ is intended to provide a high level output with the delay time t after $\overline{CAS}_1$ changes to high, $\overline{CASD}$ is held low for the delay time t. If Ext. $\overline{CAS}$ changes to low again during the delay time t, then $CAS_1$ changes to high and $\overline{CAS}_1$ changes to low, respectively. $\overline{CAS}_1$, therefore, changes to low before $\overline{CASD}$ changes to high, and $\overline{CASD}$ loses an opportunity of changing to high (it is recalled that the delay circuit DC does not provide any delay time at the downward edge of $\overline{CAS}_1$). In the case where the time $t_1$ where Ext. $\overline{CAS}$ is high is correlated as $t_1 < t$, there is not change in $\overline{CASD}$ and thus $\overline{CAS}_2$ and $\overline{CAS}_2$. This suggests that no new address is established at the address registers $A_0$–$A_7$ and that the data registers and the column decoder are not reset. However, since $CAS_1$ changes during that period, the shift register performs shift operation so that data in the next succeeding data register are outputted through the output buffer. In other words, the nibble mode comes into effect.

Unless Ext. $\overline{CAS}$ changes to low during the period t, that is, where the period of time $t_2$ in which Ext. $\overline{CAS}$ stands high is correlated as $t_2 > t$, $\overline{CASD}$ changes to high once. At time $CAS_2$ changes to low and $\overline{CAS}_2$ changes to high, resetting the data registers $DR_1$–$DR_2$, the column decoder CD, the address buffer circuit and so forth. When Ext. $\overline{CAS}$ then changes to low, a new column address is developed through the operation in (ii) above to start up the data register. In other words, the event which follows is startup of the page mode.

In brief, should the period of time in which Ext. $\overline{CAS}$ is high be shorter than the delay time t at the building-up edge of $\overline{CASDC}$, the previous column address is maintained and data are sequentially read out from the data register. The nibble mode will follow. However, should said period be longer than the building-up delay time t, a new column address is developed and the page mode comes into effect.

(iv) Ext. $\overline{CAS}$ changes to high and low repeatedly while Ext. $\overline{RAS}$ is held low. Through proper selection of the period of time in which Ext. $\overline{CAS}$ is high, the nibble mode and the page mode are optionally selectable. Ext. $\overline{CAS}$ may change to low a desired number of times while Ext. $\overline{RAS}$ is held low. Whenever Ext. $\overline{CAS}$ changes to low, data are outputted one by one, the output mode thereof being determined by the length of time in which Ext. $\overline{CAS}$ is high.

(v) Ext. $\overline{RAS}$ changes to high. $\overline{RAS}$ changes to high in synchronism with such change, resetting all of the circuits. When this occurs, $\overline{CASD}$ changes to high without delay so that $\overline{CAS}_1$ also changes to high without delay. High speed resetting is therefore possible.

Figure 11:
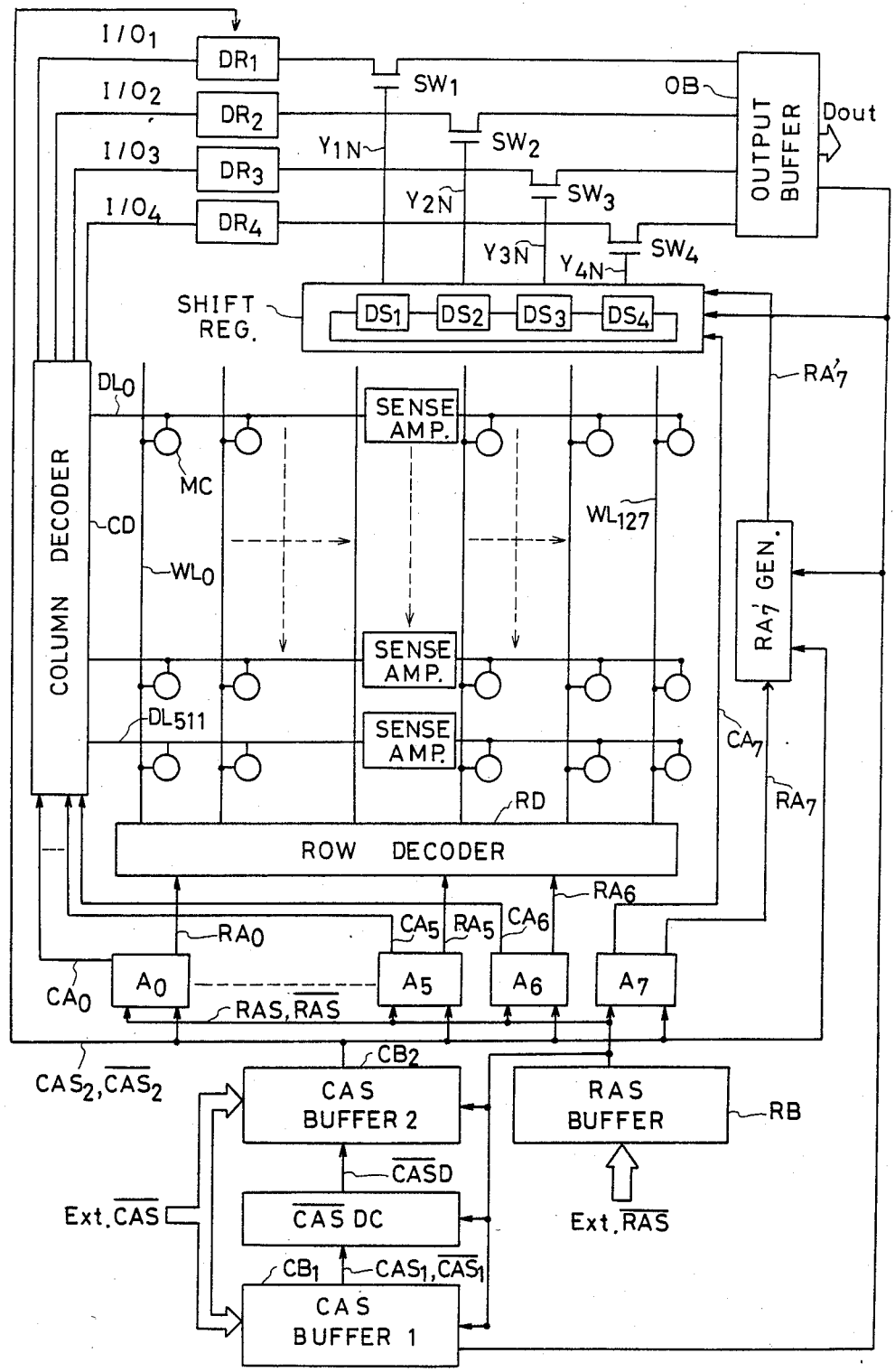
FIG. 11 is a block diagram of a semiconductor memory device according to a second embodiment of the present invention.

A second embodiment of the present invention will be discussed. A schematic view of the second embodiment is illustrated in FIG. 11. The following disclosure will set forth only the difference of the second embodiment from the first embodiment as illustrated in FIG. 4. The remaining portions of the second embodiment are similar to those in the first embodiment with regard to structure and operation.

In the circuit arrangement of FIG. 11, it is noted that a row address signal $RA_7$ and a column address signal $CA_7$ of $A_7$ out of the outputs of the address buffers $A_0$–$A_7$ are supplied to the data select registers $DS_1$–$DS_4$. The signals in the first embodiment which correspond to these inputs are the column address signals from $A_6$ and $A_7$. If data simultaneously read out from the memory array are of N bits in the present invention, then all that is necessary to do is to supply the shift register with outputs of M bits out of all of the outputs from the address buffers, where N, M are integer and $2^M = N$. The present invention is therefore is intended to encompass the device of FIG. 4 and that of FIG. 11. The problem which is presented when a total of 2 bits including 1 bit of column address outputs and 1 bit of row address outputs out of all of the output from the address buffers are used to select the data select registers, is the necessity of holding the row address signal while Ext. $\overline{RAS}$ is held low. In other words, whereas in the conventional nibble mode $CA_7$ and $RA_7$ should be supplied to the data select registers only one time, in the second embodiment $RA_7$ should be supplied to the data select registers whenever and only when the memory device comes into effect in the page mode. The reason is that, whereas in the page mode one of the data select registers should be selected, all that it necessary to do in the nibble mode is to shift the registers. In order to hold the row address signal, an $RA_7'$ generator in FIG. 11 is additionally included in the device. This circuit is interposed between the row address signal output from the address buffer $A_7$ and the data select registers $DS_1$–$DS_4$ and operates under control of the outputs from $CB_1$ and $CB_2$. The secondary row address signal $RA_7'$ from the $RA_7'$ generator assumes the following properties:

(a) Where $RA_7$ stands high and $CAS_2$ changes to high, that is, where the page mode is to become effective, $RA_7'$ changes to high.

(b) Where $CAS_2$ is held high and $\overline{CAS}_1$ changes to high, that is, where the page mode once comes into a halt, $RA_7'$ changes to low.

(c) Where $CAS_2$ is held high and then $\overline{CAS}_1$ changes to low again, that is, where the memory device comes into the nibble mode, $RA_7'$ is maintained low.

As long as $RA_7'$ assumes the above properties, $RA_7'$ and $\overline{RA_7'}$ are developed in synchronism with $CAS_2$ in the page mode and used together with $CA_7$ and $\overline{CA_7}$ newly developed in the address buffers to select output bits. In the nibble mode $RA_7'$ and $\overline{RA_7'}$ are not developed so that data loaded into the data registers in response to $RA_7$ and $CA_7$ originally developed in synchronism with RAS and $CAS_2$ are allowed to be sequentially read out by means of the shift register.

Figure 12:
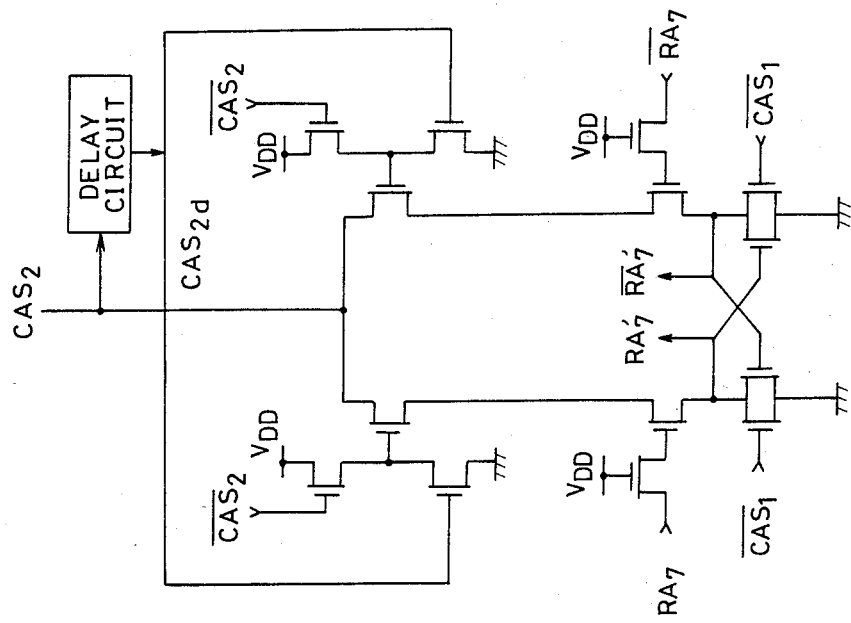
FIG. 12 is a circuit diagram of an example of a secondary row address signal generator used in the semiconductor memory device according to the second embodiment of the present invention.
Figure 13:
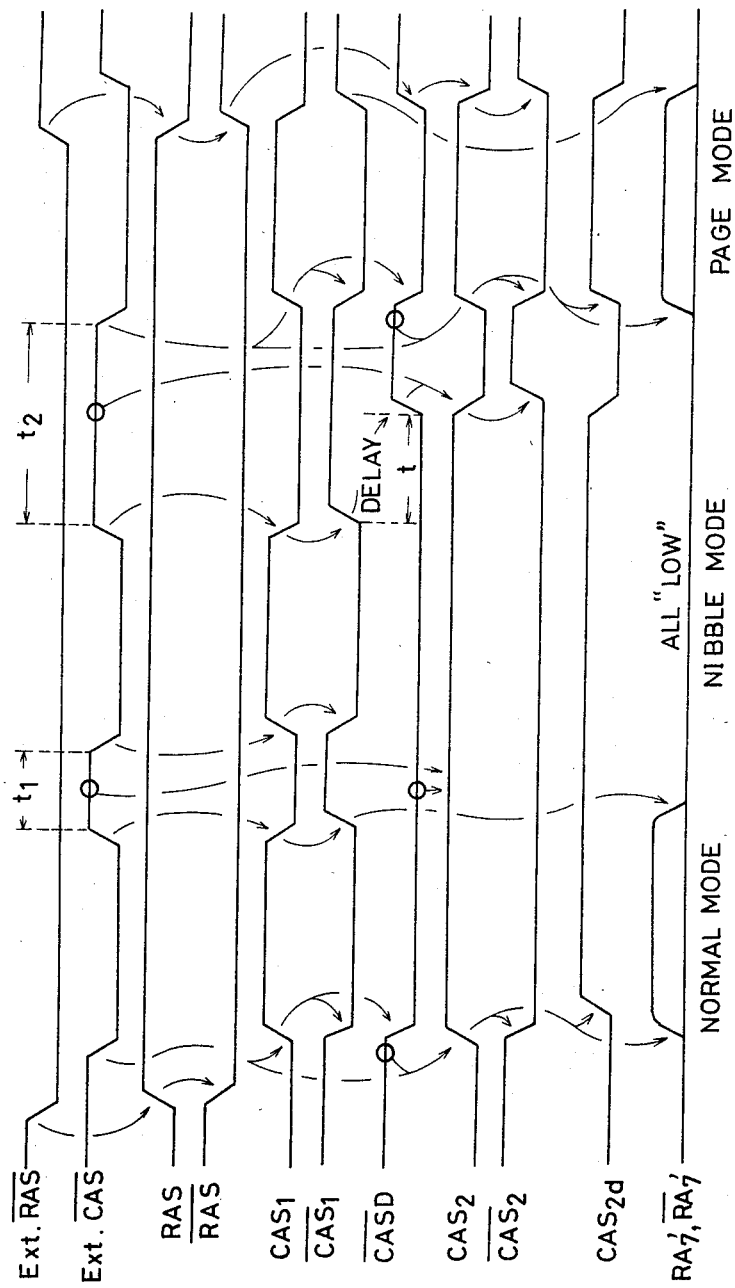
FIG. 13 is a timing chart showing various waveforms in the semiconductor memory device according to the second embodiment of the present invention.

An example of the $RA_7'$ generator implemented with MOS transistor is illustrated in FIG. 12. The circuit of FIG. 12 comprises a plurality of MOST's and a delay circuit. $V_{DD}$ is a power source. It is obvious to those skilled in the art that the circuit of FIG. 12 assures the properties (a)–(c). FIG. 13 is a timing chart showing various waveforms in the circuit of FIG. 11, wherein the waveforms Ext. $\overline{RAS}$ through $\overline{CAS}_2$ are identical with those in FIG. 10. It is noted that the waveform CAS$_{2d}$ is a signal in the RA$_7'$ generator of FIG. 12.

If Ext. $\overline{\text{RAS}}$ in FIG. 13 changes to low and then Ext. $\overline{\text{CAS}}$ changes to low, then CAS$_2$ changes to high. In the case where RA$_7$ is high under these circumstances, RA$_7'$ and $\overline{\text{RA}_7}'$ are developed due to the property (a). Whether the memory device is in the nibble mode or the page mode, it is necessary to provide a particular column address and a particular row address once and generate those addresses in the first mode immediately after Ext. $\overline{\text{RAS}}$ has changed to low. This first mode is a "normal mode" in FIG. 13. Assume now that Ext. $\overline{\text{CAS}}$ changes to high during the period $t_1 < t$ and thereafter changes to low again. Under these circumstances CAS$_2$ does not change and $\overline{\text{CAS}}_1$ changes to high and then low. Due to the properties (b) and (c), RA$_7'$ changes to low and keeps low. Data are read out in the nibble mode. Next, it is assumed that Ext. $\overline{\text{CAS}}$ changes to high during the period $t_2 > t$ and then changes to low. Consequently, $\overline{\text{CAS}}_2$ changes to high and then changes to low. RA$_7'$ and $\overline{\text{RA}_7}'$ are developed due to the property (a) so that data are read out in the page mode. Operations of the remaining circuit portions under these circumstances are similar to those in the first embodiment.

Provided that the device of FIG. 11 according to the second embodiment is used for the system that a total of 2 bits including 1 bit of the row address and the 1 bit of the column address is used to determine the head of the nibble bits, both the page mode and the nibble mode may be available on a single chip.

The circuits are built up with the N channel MOS transistors in the foregoing embodiments, but they may be set up with P channel transistors, CMOS transistors, bipolar transistors, etc. The second CAS buffer circuit has only to include at the first stage thereof the NAND logic circuit receiving the output of the delay circuit and Ext. $\overline{\text{CAS}}$ and should not be limited to the foregoing embodiments. Optical M bits of the outputs of the address buffers may be used to select the first output bit.

Although the present invention has been described and illustrated in detail, it is clearly understood that the same is by way of illustration and example only and is not the present invention being limited only by the terms of the appended claims.

What is claimed is:

1. A semiconductor memory device with a memory array for storing data, said data being read out in response to an external row address strobe signal and an external column address strobe signal, said semiconductor memory device comprising:
   internal row address strobe signal generator means for generating a signal synchronous with said external row address strobe signal;
   first internal column address strobe signal generator means for generating a signal synchronous with said external column address strobe signal;
   external column address strobe signal discriminating means responsive to the output of said first internal column address strobe signal generator means and said external column address strobe signal for determining whether the length of time in which said external column address strobe signal is at a given level is longer than a predetermined length of time, and generating an output representative of results of such discrimination;
   data address signal generator means responsive to the output of said internal row address strobe signal generator means and the output of said external column address strobe signal discriminating means for generating an address signal in connection with data to be read out from said memory array;
   read out means responsive to the output of said data address signal generator means for reading out a plurality of data from said memory array; and
   output means responsive to a portion of the output of said data address signal generator means, the output of said first internal column address strobe signal generator means and the output of said external column address strobe signal discriminating means for outputting at least one of the plurality of said data read out from said read out means.

2. A semiconductor memory device as set forth in claim 1 wherein said external column address strobe signal discriminating means comprise:
   delayed signal generator means responsive to the output of said first internal column address strobe signal generator means and the output of said internal row address strobe signal generator means for generating an output delayed; signal said delayed signal generator means comprising:
   delay means for developing a first delay time when the output of said first internal column address strobe signal generator means changes from a first level to a second level, and then generating an output changing from said first level to said second level, said delay means further developing a second delay time shorter than said first delay time when the output of said first internal column address strobe signal generator means changes from said second level to said first level, and then generating an output changing from said second level to said first level; and
   logical sum signal generator means for evaluating the logical sum of the output of said delay means and the output of said internal row address strobe signal generator means and providing a delayed signal representative of said logical sum;
   second internal column address strobe signal generator means for generating a signal responsive to the output of said delayed signal generator means and said external column address strobe signal, said second internal column address strobe signal generator means including at the first stage thereof NAND output generator means for generating the NAND output of the output of said delayed generator means and said external column address strobe signal.

3. A semiconductor memory device as set forth in claim 2 wherein said predetermined length of time is identical to said first delay time and said second delay time is substantially zero.

4. A semiconductor memory device as set forth in claim 2 wherein said output means comprise:
   a plurality of data register means for storing said plurality of the data read out by said readout means; and
   output select means responsive to said portion of the output of said data address generator means for selecting one of said plurality of the data register means and responsive to the output of said first internal column address strobe signal generator means for outputting data stored in said selected one of the data register means.

5. A semiconductor memory device as set forth in claim 4 wherein said plurality of the data register means are reset in response to the output of said second internal column address strobe signal generator means and said output select means include shift register means, said shift register means performing shift operation in response to the output of said first internal column address strobe signal generator means.

6. A semiconductor memory device as set forth in claim 4 wherein said data as stored in said plurality of the data register means are N bits long and said portion of the output of said data address generator means for selection of one of said plurality of the data register means are M bits long where N and M are integers and $N=2^M$.

7. A semiconductor memory device as set forth in claim 6 wherein the output of said data address generator means comprises row address signals and column address signals and said M bits are a portion of said column address signals.

8. A semiconductor memory device as set forth in claim 7 wherein said N is 4 and said M is 2.

9. A semiconductor memory device as set forth in claim 6 wherein the output of said data address generator means comprises row address signals and column address signals and said M bits comprise at least 1 bit of said row address signals and at least 1 bit of said column address signals, and wherein said semiconductor memory device further comprises means for receiving and holding said at least 1 bit of said row address signals while said external row address strobe signal is in active state, for generating a secondary row address signal corresponding to said at least 1 bit of said row address strobe signals so held responsive to the output of said second internal address strobe signal generator, and for inhibiting generation of said secondary row address signal responsive to the output of said first column address signal generator means.

10. A semiconductor memory device as set forth in claim 9 wherein said N is 4 and said M is 2.

11. A semiconductor memory device as set forth in claim 1 wherein said semiconductor device is formed on a single semiconductor chip.

12. A semiconductor memory device as set forth in claim 11 wherein said semiconductor chip is a 64K dynamic RAM chip.

* * * * *